United States Patent [19]
Ovens

[11] Patent Number: 4,782,248
[45] Date of Patent: Nov. 1, 1988

[54] STL EXCLUSIVE-OR BUFFER
[75] Inventor: Kevin M. Ovens, Garland, Tex.
[73] Assignee: Texas Instruments Incorporated, Dallas, Tex.
[21] Appl. No.: 944,625
[22] Filed: Dec. 19, 1986
[51] Int. Cl.[4] .................. H03K 19/086; H03K 19/20; H03K 19/092; G06F 7/50
[52] U.S. Cl. .................. 307/455; 307/445; 307/458; 307/471; 307/475
[58] Field of Search .............. 307/445, 454-455, 307/458, 471, 475, 262, 264

[56] References Cited
FOREIGN PATENT DOCUMENTS
0129428 10/1981 Japan .................. 307/471

Primary Examiner—John S. Heyman
Assistant Examiner—M. R. Wambach
Attorney, Agent, or Firm—Thomas R. Fitzgerald; Leo N. Heiting; Melvin Sharp

[57] ABSTRACT

The disclosure relates to a shottky transistor logic (STL) exclusive-OR circuit with a buffer wherein the gate portion uses a pair of shottky clamp transistors having the base electrode of each cross coupled to the emitter of the other transistor through a schottky diode. Provision is made to provide and AND function at the input by providing plural emitters, each coupled to a separate input, on one of the transistors. A buffer circuit is provided to assit in operation at two volts rather than five volts.

2 Claims, 1 Drawing Sheet

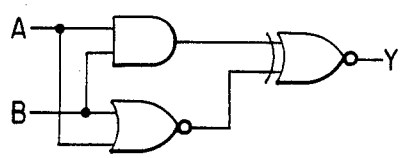
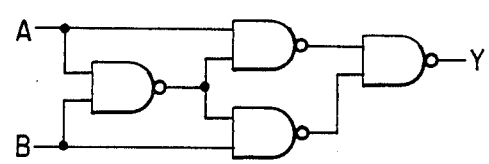
Fig. 1    Fig. 2
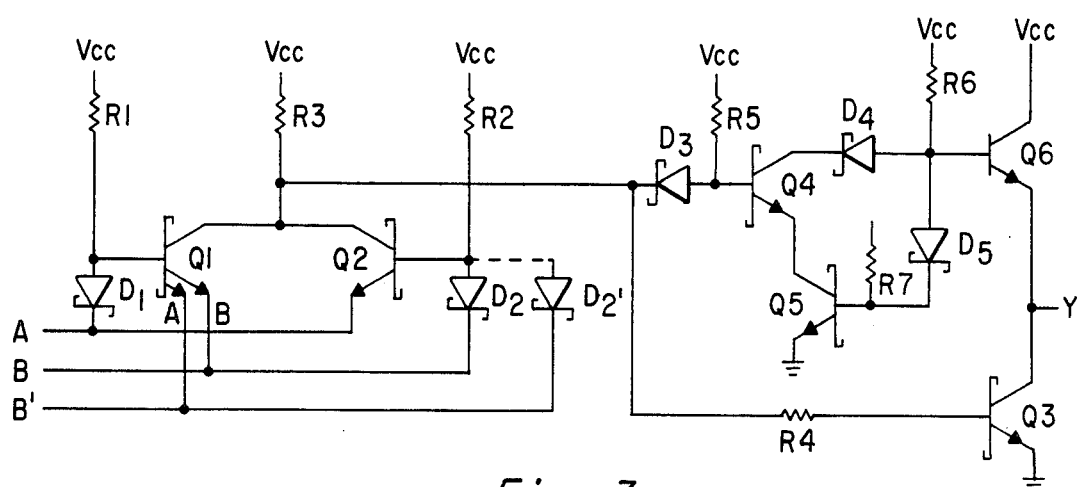
Fig. 3
Fig. 4

STL EXCLUSIVE-OR BUFFER

BACKGROUND OF THE INVENTION

1. Field of the Invention

This invention relates to a Schottky transistor logic (STL) exclusive-OR gate circuit and to an exclusive-NOR buffer circuit.

2. Brief Description of the Prior Art

Prior art STL exclusive-OR circuits have normally required four gates, such circuits thereby having three gate delays. In some cases the number of gate delays has been reduced to two, however the number of components required has been large and the buffer function is not present. There was a further problem with such prior art TTL exclusive-OR circuits in that it was difficult to translate the logic levels down to operate with a two volt supply, this being the normal operating voltage for schottky devices, rather than with a five volt supply used with TTL. Prior art TTL exclusive-OR circuits are also known wherein cross-coupled base to emitter connections between transistor pairs are provided, thereby forming the desired circuit. In such circuits, the cross coupling is direct rather than through a diode. It is apparent that a reduction in the number of gate delays would be desirable in order to increase the speed of operation of the circuit. It is also apparent that a reduction in the number of components required is desirable, not only in view of economics, but also to reduce power consumption.

SUMMARY OF THE INVENTION

In accordance with the present invention, there is provided an STL exclusive-OR circuit with a buffer at its output which has, at most, only two gate delays, thereby providing an advantage over the prior art of having very low signal swings and greater speed of operation. The circuit also requires fewer components as compared with comparable prior art circuits, thereby requiring less power as well as providing the obvious advantage of economics. The exclusive-OR circuit also can provide an AND function at the input thereof by adding an additional emitter input to one transistor of the cross-coupled transistor pair and a schottky diode in the base circuit of the other transistor of the transistor pair, this option being unavailable in the prior art without the addition of the circuitry required for a complete additional AND gate. This addition of the AND function only adds the additional delay caused by the added capacitance introduced into the circuit, this being much less than one gate delay. The buffer is added to the output of the exclusive-OR circuit because such logic cannot be performed with only the gate circuit itself due to the logic level translation problem as noted above. The inputs to the STL exclusive-OR circuit must pull down to about 200 millivolts. This makes the low level for the exclusive-NOR circuit 400 millivolts. Therefore the buffer gate must be added.

BRIEF DESCRIPTION OF THE DRAWINGS

FIG. 1 is a block diagram of a first typical prior art STL exclusive-OR circuit;

FIG. 2 is a block diagram of a second prior art exclusive OR circuit;

FIG. 3 is a circuit diagram of an STL exclusive-OR circuit with a buffer in accordance with the present invention; and FIG. 4 is a block diagram of the additional AND function of FIG. 3.

DESCRIPTION OF THE PREFERRED EMBODIMENTS

Referring first to FIG. 1, there is shown a block diagram of a first prior art STL exclusive-OR circuit. It can be seen from this circuit that there are three levels of delay. Also, each of the individual standard circuits shown requires a large number of components relative to the circuit of the subject invention described hereinbelow. The same problem exists with the second prior art STL exclusive-OR circuit shown in FIG. 2. Again, three levels of delay are present and four individual logic circuits are required.

The basic circuit for the exclusive-NOR circuit and buffer in accordance with the present invention is shown in FIG. 3. The exclusive-NOR portion of the circuit includes a pair of cross coupled schottky clamp transistors Q1 and Q2 with the emitter B of transistor Q1 coupled through platinum silicide schottky diode D2 to the base of transistor Q2 and the emitter of transistor Q2 coupled through platinum silicide schottky diode D1 to the base of transistor Q1. It should be understood that transistor Q1 can be of the single emitter variety when only one input is to be provided thereto or of the multiple emitter variety, as shown, when plural inputs are to be applied thereto in the manner discussed hereinbelow. An input A is coupled to the emitter of transistor Q2 and to the base of transistor Q1 through diode D1 and an input B is coupled to the emitter B of transistor Q1 and to the base of transistor Q2 through diode D2. The collectors of transistors Q1 and Q2 are both coupled together and coupled through resistor R3 to a voltage source Vcc. The base of transistor Q1 is also coupled to Vcc through resistor R1 whereas the base of transistor Q2 is coupled to Vcc through resistor R2.

In operation, assuming the A and B inputs are both low, then resistors R1 and R2 conduct through the schottky diodes D1 and D2, since the schottky diode voltage drop (0.6 volts) is less than than the base-emitter voltage drop of transistors Q1 and Q2 (0.8 volts). This lowers the voltage on the base of each of the transistors Q1 and Q2 so that these transistors are off and do not conduct. A key feature is that the low voltage levels on the A and B inputs must be similar. If the low voltage levels on the A and B inputs are off by more than the voltage difference between the voltage drop of a forward biased base-emitter junction of a schottky clamp transistor and the forward biased schottky diode, then the circuit will not operate properly. So this is a condition of the circuitry of FIG. 3.

If both A and B inputs are high, then the emitters of transistors Q1 and Q2 are high, so these transistors do not conduct. In both of the above cases wherein the inputs are the same, the transistors Q1 and Q2 are off, either through the diodes D1 and D2 when the inputs are low or because the emitters of transistors Q1 and Q2 are high. In both cases, the outputs, the collectors of transistors Q1 and Q2, are high.

If the inputs A and B are both different, as, for example, A being low and B going from a low to a high, resistor R1 will conduct through diode D1 to the A input to lower the voltage on the base of transistor Q1 and divert base current therefrom and through diode D1. Current will also be conducted through resistor R2 and into the base-emitter junction of transistor Q2 to the A input. This action will occur because input B is high, thereby reverse biasing diode D2. The result is that transistor Q2 conducts, thereby forcing a low voltage on the collectors of transistors Q1 and Q2. The same analysis is true with the A input high and the B input low with the operation being conducted on the mirror image components in FIG. 3.

A major advantage of the above described circuit of FIG. 3 is that the exclusive NOR function is provided with seven components including three resistors instead of four full logic gates. The circuit displays at most one gate delay.

The A and B inputs will go down to a Von level (the voltage drop across an on transistor) with an additional Von through transistor Q1 or Q2. Therefore the low level on the collectors of transistors Q1 and Q2 is 400 mVolts rather than 200 mVolts. Accordingly, the full buffer shown in FIG. 3 is not required, but only schottky clamp transistor Q3, the base of which is connected to the collectors of transistors Q1 and Q2 for operation with five (5) volt logic. The problem with using only transistor Q3 is that it is incapable of driving very heavy loads. Accordingly, the buffer circuit has been modified and the thresholds changed to operate with the exclusive NOR circuit of FIG. 3.

With a low level on the input to the buffer (the collectors of transistors Q1 and Q2), about 400 mVolts (200 mVolts at the circuit input and 200 mVolts across the on transistor Q1 or Q2), current flows from Vcc through resistor R5 and through titanium tungsten diode D3. To insure this operation, it is necessary that the voltage Von of transistors Q1 and Q2, the voltage Von at the input of the exclusive NOR gate and the voltage drop across diode D3 be low enough to insure that schottky clamp transistor Q4 is turned off. For this reason, schottky clamp transistor Q5 is added to the circuit, this transistor adding 200 mVolts to the threshold of transistor Q4 to offset the 200 mVolts voltage drop for the exclusive NOR circuit. Therefore, when an input to the exclusive NOR circuit is low, the low level at the base of transistor Q4 is 0.3 volts across diode D3, 0.2 volts across transistor Q1 or Q2 and 0.2 volts across the input. This pulls down the base of transistor Q4 to about 0.7 volts, forcing the base-emitter voltage of transistor Q4 to 0.5 volts and shuts off transistor Q4.

When transistors Q1 and Q2 turn on and the collectors are at 400 millivolts, that voltage is low enough to keep pull down transistor Q3 off. So the pull down transistor Q3 is non-conducting and pull up NPN transistor Q6 is conducting to provide a high on the output Y. The base voltage of transistor Q6 rises from 0.7 volts [diode D4 (0.3 volts), transistor Q4 (0.2 volts) and transistor Q5 (0.2 volts] to 1.4 volts [diode D5 (0.6 volts) and transistor Q5 (0.8 volts)], forcing the output to rise from 0.2 volts (transistor Q3) to 0.6 volts (diode D5, resistor R5 and transistor Q6).

If the A and B inputs are the same, then there is a high on the collectors of transistors Q1 and Q2 which are both off. Current is then conducted from Vcc, through resistor R3 into resistor R4 to the base of transistor Q3. This turns transistor Q3 on and forces a low level on the output at Y provided transistor Q6 is turned off. The high level at the collectors of transistors Q1 and Q2 is determined by the ratio of resistors R3 to R4. This ratio is made high enough to force a high level on the cathode of diode D3. Once this condition occurs, resistor R5 conducts into the base of transistor Q4 with transistor Q5 remaining on. When transistor Q4 turns on, its collector goes low and resistor R6 conducts through platinum silicide diode D4. The low level with conduction through resistor R6, diode D4 and transistors Q4 and Q5 is low enough to hold transistor Q Q6 off. This is accomplished by the proper use of schottky diodes and transistors to provide the above required voltage and threshold conditions such components being specifically specified hereinabove. However, it should be understood that other schottky components which bear the same ratios of voltage drop to each other can be substituted for those specifically disclosed herein. For example, the forward voltage drop across a titanium tungsten diode is 0.3 volts, across a platinum silicide diode is 0.6 volts, from base to emitter of an on schottky clamp transistor is 0.8 volts and 0.2 volts from collector or emitter. For the same transistor in the off condition, the base to emitter voltage is 0.6 volts or less and the collector to emitter is open. The base to emitter voltage across an on NPN bipolar transistor is 0.8 volts. All of the above voltages are approximate.

As a further embodiment, a platinum silicide diode D'2 is added on the base of transistor Q2 and an additional emitter A is added on transistor Q1, the additional emitter being coupled to input B'. This forms and AND function at the input to the exclusive-NOR function to provide a circuit as shown in FIG. 4. Therefore, in order to obtain a high on the B input of the former circuit described hereinabove, both the B and the B' inputs must be high. This is accomplished with essentially no increase in power or decrease in speed of circuit operation. The circuit otherwise operates as discussed hereinabove.

The novel circuitry herein permits operation of gates at lower voltage than in the prior art, thereby reducing power consumption.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:
1. A STL logic circuit comprising:
a pair of schottky clamped transistors the emitter of each transistor being coupled through a platinum silicon schottky diode to the base of the other transistor;
the bases of each of said transistors being coupled to a voltage source through a resistor;
one of said transistors having a second emitter, said second emitter being coupled to the base of the other transistor through a further schottky diode;
the collectors of said pair of schottky clamped transistors being coupled together and forming the output thereof;
a resistor coupled between said collectors of said pair of schottky clamped transistors and a voltage source Vcc; and
buffer means coupled to said output to translate the voltage level of said output to a different value, said buffer means including a third schottky clamp transistor, a schottky diode coupled between the collectors of said pair of schottky clamped transistors and the base of the third transistor, the emitter of said third transistor being coupled to feedback means, a fourth schottky clamp transistor, a resistor coupled between the base of the fourth transistor and the collector of said pair of schottky clamped transistors, the emitter of said fourth transistor being coupled to a second voltage source, a bipolar transistor having its electron emitting electrode coupled to the collector of said fourth transistor, and a schottky diode coupled between the collector of said third transistor wherein the collector of said bipolar transistor is coupled to said voltage source and the control electrode of the bipolar transistor, the output of said buffer means being taken from the electron emitting electrode of said bipolar transistor.

2. The circuit of claim 1, wherein said feedback means comprises a fifth schottky clamp transistor having its collector coupled to the emitter of the third transistor, its emitter coupled to said second voltage source and a further schottky diode coupled between the control electrode of the bipolar transistor and the base of the fifth transistor.

* * * * *